(12) United States Patent
En et al.

(10) Patent No.: US 6,573,172 B1
(45) Date of Patent: Jun. 3, 2003

(54) METHODS FOR IMPROVING CARRIER MOBILITY OF PMOS AND NMOS DEVICES

(75) Inventors: William George En, Milpitas, CA (US); Angela Hui, Fremont, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/244,439

(22) Filed: Sep. 16, 2002

(51) Int. Cl.$^7$ .......................................... H01L 21/4763
(52) U.S. Cl. ...................................... 438/626; 438/170
(58) Field of Search ................................. 438/153, 154, 438/157, 170, 197, 204, 236, 253, 626

(56) References Cited

U.S. PATENT DOCUMENTS

| | | |
|---|---|---|
| 5,683,934 A | 11/1997 | Candelaria |
| 6,087,241 A | 7/2000 | St. Amand et al. |
| 6,211,064 B1 * | 4/2001 | Lee |
| 6,406,973 B1 | 6/2002 | Lee |

* cited by examiner

Primary Examiner—Hoai Ho
Assistant Examiner—Phuc T. Dang
(74) Attorney, Agent, or Firm—Eschweiler & Associates, LLC

(57) ABSTRACT

Methods are described for fabricating semiconductor devices, in which a tensile film is formed over PMOS transistors to cause a compressive stress therein and a compressive film is formed over NMOS transistors to achieve a tensile stress therein, by which improved carrier mobility is facilitated in both PMOS and NMOS devices.

30 Claims, 5 Drawing Sheets

METHODS FOR IMPROVING CARRIER MOBILITY OF PMOS AND NMOS DEVICES

FIELD OF INVENTION

The present invention relates generally to semiconductor device processing and more particularly to methods for selectively inducing stress in PMOS and NMOS transistors in the manufacture of semiconductor devices.

BACKGROUND OF THE INVENTION

As semiconductor device switching speeds continue to increase and operating voltage levels continue to decrease, the performance of MOS and other types of transistors needs to be correspondingly improved. The carrier mobility in a MOS transistor has a significant impact on power consumption and switching performance, where improvement in carrier mobility allows faster switching speeds. The carrier mobility is a measure of the average speed of a carrier (e.g., holes or electrons) in a given semiconductor, given by the average drift velocity of the carrier per unit electric field. Improving carrier mobility can improve the switching speed of a MOS transistor, as well as allow operation at lower voltages.

One way of improving carrier mobility involves reducing the channel length and gate dielectric thickness in order to improve current drive and switching performance. However, this approach may increase gate tunneling current, which in turn degrades the performance of the device by increasing off state leakage. In addition, decreasing gate length generally calls for more complicated and costly lithography processing methods and systems.

Other attempts at improving carrier mobility include deposition of silicon/germanium alloy layers between upper and lower silicon layers under compressive stress, which enhances hole carrier mobility in a channel region. However, such buried silicon/germanium channel layer devices have shortcomings, including increased alloy scattering in the channel region that degrades electron mobility, a lack of favorable conduction band offset which may even mitigate the enhancement of electron mobility, and the need for large germanium concentrations to produce strain and thus enhanced mobility.

The use of these additional alloy and silicon layers, moreover, add further processing steps and complexity to the manufacturing process. Furthermore, in CMOS devices, the stress imparted by such a buried silicon/germanium channel layer may adversely affect one type of transistor while improving another. Thus, there remains a need for methods by which the carrier mobility of both NMOS and PMOS transistors may be improved so as to facilitate improved switching speed and low-power, low-voltage operation of CMOS devices, without significantly adding to the cost or complexity of the manufacturing process.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

One aspect of the invention involves methods for fabricating semiconductor devices, in which a tensile film is formed over PMOS transistors to cause a compressive stress therein and a compressive film is formed over NMOS transistors to achieve a tensile device stress. The inventors have found that compressive stress in PMOS device channel regions improves carrier mobility, and further that tensile stress in the channel regions of NMOS transistors improves the carrier mobility thereof. The invention may thus be employed to facilitate improved carrier mobility in both PMOS and NMOS devices.

In one implementation, first and second nitride layers are formed over the PMOS and NMOS transistors using first and second plasma-enhanced chemical vapor deposition (PECVD) processes, respectively. The first deposition provides a tensile nitride film to impart a compressive stress in the channel region of the PMOS device, in turn, increasing the PMOS carrier mobility. The tensile (first) film is removed from over the NMOS device, and the second deposition then provides a compressive nitride film over the NMOS transistor. This compressive film is removed from over the PMOS device, but remains over the NMOS so as to induce a tensile stress in the NMOS channel region. The tensile stress in the NMOS channel region improves the carrier mobility thereof Thus, the invention may be successfully employed to improve carrier mobility in both NMOS and PMOS transistors, for instance, in a CMOS device manufacturing process.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
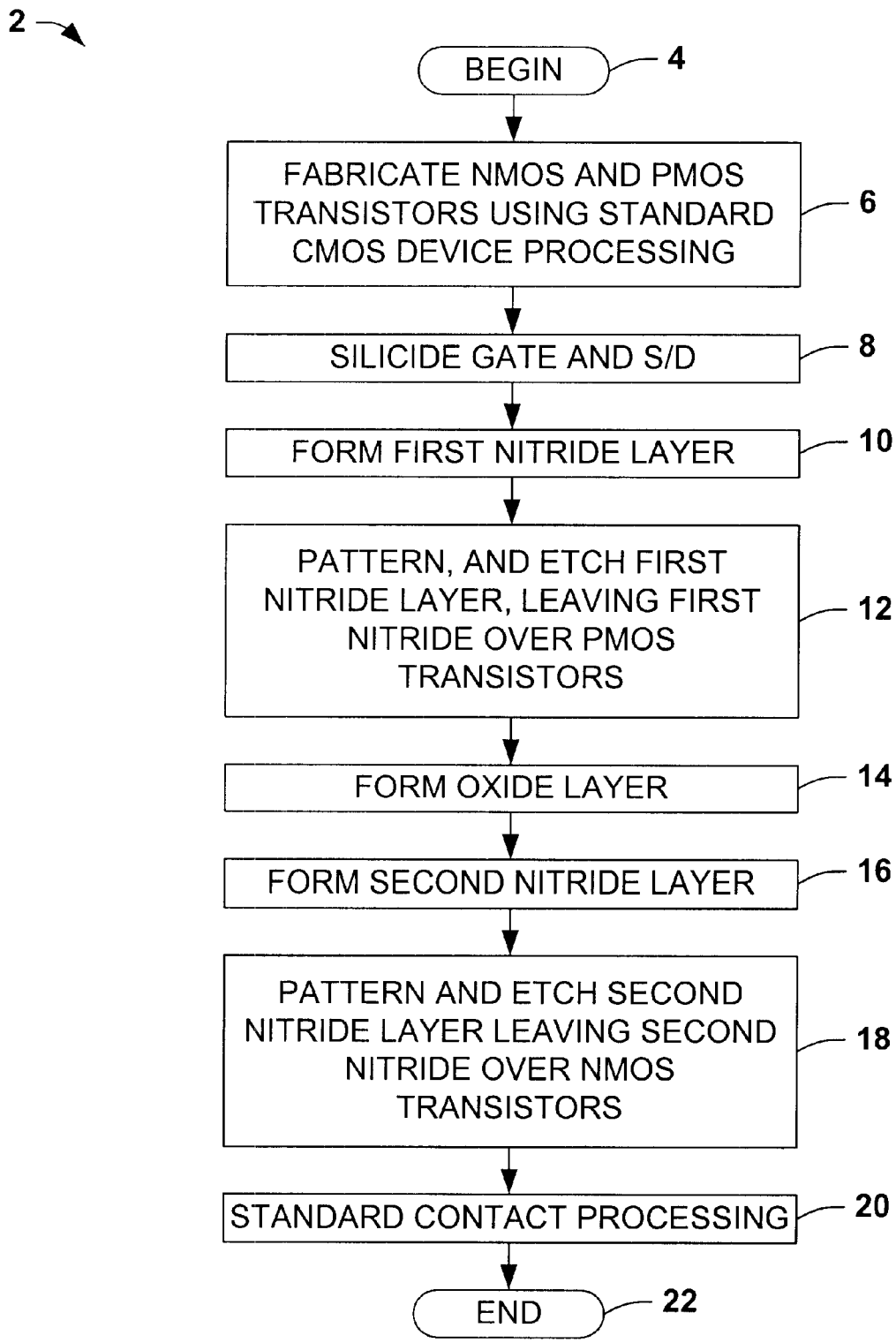
FIG. 1 is a flow diagram illustrating an exemplary method of fabricating transistors in accordance with one or more aspects of the present invention.

One or more implementations of the present invention will now be described with reference to the drawings, wherein like reference numerals are used to refer to like elements throughout, and wherein the various structures are not necessarily drawn to scale. The present invention relates to methods of producing semiconductor devices with improved transistor carrier mobility, in which the mobility of both NMOS and PMOS transistors may be improved using selectively located compressive and tensile films.

One exemplary implementation of the invention is illustrated and described below, in which the structures illustrated herein are not necessarily drawn to scale. In the illustrated example, first and second nitride films are formed over PMOS and NMOS devices, respectively, using different plasma-enhanced chemical vapor deposition (PECVD) processes. The deposition processes are adjusted to selectively provide a first nitride film, which has a tensile film stress due to the deposition process parameters and materials. The deposited tensile film is selectively etched to remove any tensile film from over the NMOS devices, wherein the remaining tensile film over the PMOS transistors induces a compressive stress in the channel regions thereof. A second nitride film is deposited using a second deposition process to form a compressive film, which is then selectively etched away from the PMOS transistors, and which remains over the NMOS devices to provide a tensile stress therein.

An intervening oxide layer is formed in the exemplary process illustrated below between the first and second nitride layer depositions to facilitate the selective patterning of the stress inducing layers in the illustrated implementation. However, other techniques may be implemented using patterned etching which is selective between a tensile film and a compressive film. In such an implementation, a tensile film material may thus be selectively provided over the PMOS transistors (e.g., and not over the NMOS devices) and compressive film material is provided over the NMOS devices (e.g., and not over the PMOS devices), wherein an intervening oxide layer need not be provided.

In this regard, it will be appreciated that the invention is not limited to the exemplary film materials, structures, and method sequences illustrated and described below.

Accordingly, nitrides or other materials may be used in forming the tensile and/or compressive layers or films, and any appropriate deposition techniques may be employed in forming these films, including CVD, PECVD, and others, within the scope of the present invention. Further, any appropriate patterning techniques may be employed in locating the various films over particular transistor types, including but not limited to the selective etching processes and the use of an intervening oxide layer illustrated and described below.

Referring initially to FIG. 1, an exemplary method 2 is illustrated for fabricating semiconductor devices in accordance with various aspects of the present invention. Although the method 2 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of the devices and structures illustrated and described herein as well as in association with other structures not illustrated.

Beginning at 4, the method 2 provides for fabricating NMOS and PMOS transistors in a wafer at 6 using any appropriate processing techniques as are known. For example, the method 2 may be employed as part of a CMOS integrated circuit fabrication process flow in which both NMOS and PMOS transistors are formed in a silicon wafer. At 8, silicide contacts are formed over the electrical terminals of the transistor devices (e.g., the gate and source/drain terminals), using any appropriate silicidation processing steps. The silicide contacts provide for low impedance electrical contact with subsequently formed interconnect layers and conductive metal features thereof (e.g., FIG. 2I below), whereby various transistors and other electrical devices in the wafer can be interconnected to form integrated circuits.

At 10, a first nitride layer is formed over one or more PMOS transistors in the wafer. As discussed above, the first nitride layer has internal tensile stress characteristics which cause a compressive stress in at least a portion of the underlying PMOS transistors. In particular, the inventors have found that imparting a compressive stress in the channel region of the PMOS transistors (e.g., in an n-well in a silicon substrate region underlying a gate structure between the source/drain regions) results in improved carrier mobility, thereby enhancing the performance of the PMOS devices.

The first nitride layer is formed at 10 by depositing a nitride layer using a first PECVD deposition process, and is then selectively etched at 12 using a patterned resist mask, to remove the first nitride from over the NMOS transistors, while leaving the first nitride (e.g., tensile) material over the PMOS transistors. Any appropriate lithographic or other type patterning and wet or dry etching may be employed at 12 within the scope of the present invention, by which the first nitride material remains over the PMOS transistors and not over the NMOS transistors.

In the illustrated example, the first nitride is formed at 10 using a first PECVD process with a high frequency RF plasma excitation power of about 400 W or more at a frequency of about 13.56 MHz, such as about 400 W or more and about 600 W or less at a pressure of about 1.7 Torr or more and about 2.1 Torr or less using $NH_3$, $SiH_4$, and $N_2$ gases. No heater block power (e.g., low frequency RF power) is used in the first PECVD process at 10 in this example. In one implementation, the first PECVD process at 10 comprises providing $NH_3$ gas at a flow rate of about 2–4 standard liters per minute (slm), providing $SiH_4$ gas at a flow rate of about 300–400 standard cubic centimeters per minute (sccm), and providing $N_2$ gas at a flow rate of about 2–4 slm while the first nitride (e.g., tensile stress) layer is deposited.

While not wishing to be tied to any particular theory, it is believed that the employment of this level and frequency of plasma excitation voltage (high frequency RF voltage) in the above deposition conditions at 10 provides very tensile stress material for the first nitride layer, for example, having tensile material stresses of about +7.0 E9 dynes/$cm^2$. In this regard, it is believed that the amount of ionic bombardment of the wafer associated with this level of plasma excitation facilitates the formation of tensile nitride material, although other process parameters and techniques may be employed for providing tensile films, including variations in the plasma excitation voltage level and frequency. Thus, other implementations of the invention are possible using nitrides or other materials and deposition processes, wherein a tensile film is formed over the PMOS transistors to impart a compressive stress in at least a portion thereof within the scope of the invention. As illustrated and described further below with respect to FIGS. 2C and 2D, the deposited first nitride layer is then exposed to a patterned etch process at 12 to remove the tensile material from over the NMOS devices in the wafer, and an oxide layer is formed over the wafer at 14 using any appropriate deposition or thermal oxidation process or processes.

At 16, a second nitride layer is formed over the oxide layer, having a compressive stress associated therewith, which causes a tensile stress in at least a portion of the NMOS transistors. The inventors have appreciated that tensile stress in the channel region of the NMOS devices results in improved carrier mobility, thereby enhancing the NMOS device performance. The second nitride layer is formed at 16 through deposition of a second nitride material using a second PECVD deposition process. Thereafter at 18, the second nitride layer is selectively etched to remove the second nitride from over the PMOS transistors, while leaving the second nitride over the NMOS transistors using any appropriate patterning and etching processes as are known. Thus, the device at 18 has first (e.g., tensile) nitride material over the PMOS transistors and second (e.g., compressive) nitride material over the NMOS devices.

In the illustrated example, the second nitride is formed at 16 using a second PECVD process with a high frequency RF plasma excitation power of about 400 W or less at a frequency of about 13.56 MHz, such as about 300–400 W at a pressure of about 1.7–2.1 Torr using $NH_3$, $SiH_4$, and $N_2$ gases. In addition, low frequency RF heater power is provided in the second PECVD process at 16, for example, at about 400–500 W. In the illustrated implementation, the second PECVD process at 16 comprises providing $NH_3$ gas at about 2–4 slm, $SiH_4$ gas at about 300–400 sccm, and $N_2$ gas at about 2–4 slm while depositing the second (e.g., compressive stress) nitride layer. Following the patterned etching at 18, the second nitride material remains over the NMOS transistors, imparting a tensile stress in the channel regions thereof, which in turn has been found to improve the NMOS carrier mobility. Contact and other back end processing is then performed at 20 before the exemplary method 2 ends at 22.

The lower level of plasma excitation voltage in combination with the use of low frequency RF heater power in the second PECVD process at 16 has been found to provide very compressive stress material for the first nitride layer, for example, having compressive material stresses of about −10.0 E9 dynes/$cm^2$, although other process parameters and techniques may be employed for providing compressive films. In this regard, other materials and deposition processes may be employed in forming a compressive film over the NMOS transistors to impart a tensile stress therein in accordance with this aspect of the invention.

Figure 2A:
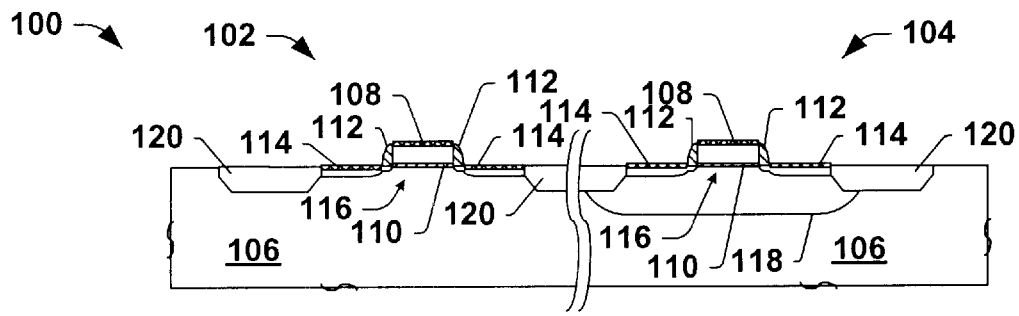
FIG. 2A is a partial side elevation view in section illustrating an exemplary CMOS device at an intermediate stage of fabrication in which an NMOS and a PMOS transistor have been formed with silicided gate and source/drain terminals in a wafer.
Figure 2B:
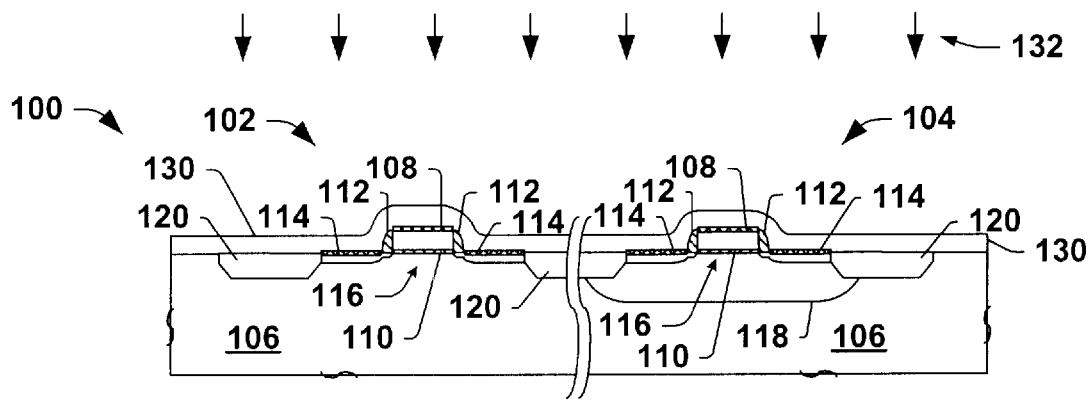
FIG. 2B is a partial side elevation view in section illustrating deposition of a first tensile nitride layer over the wafer of FIG. 2A to impart a compressive stress in the PMOS transistor in accordance with an aspect of the invention.
Figure 2C:
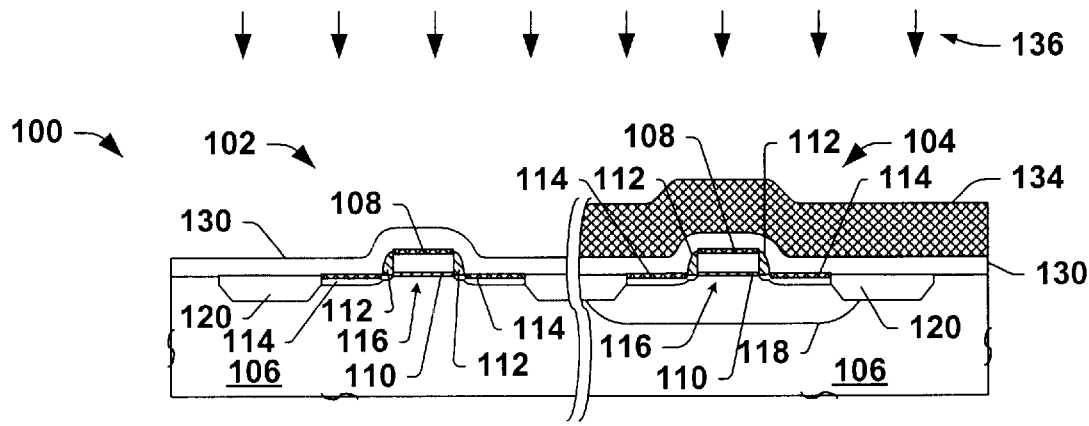
FIG. 2C is a partial side elevation view in section illustrating a first patterned etch process removing portions of the first nitride material from over the NMOS transistor and leaving the first nitride material over the PMOS transistor in the wafer of FIGS. 2A and 2B.
Figure 2D:
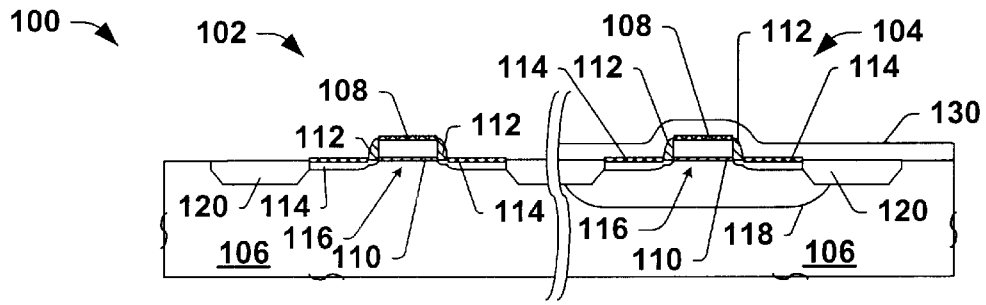
FIG. 2D is a partial side elevation view in section illustrating the wafer of FIGS. 2A–2C following removal of the first nitride material from over the NMOS transistor.

FIGS. 2A–2I illustrate an example of a CMOS device 100 processed in accordance with various aspects of the present invention. The device 100 is illustrated in FIG. 2A at an intermediate stage of fabrication in which an enhancement type NMOS transistor 102 and a PMOS transistor 104 have been formed in a silicon wafer substrate 106. The devices 104 and 106 individually comprise a gate 108, such as polysilicon formed over a thin gate oxide 110, and on which a silicide gate contact has been formed, with sidewall spacers 112 formed along the sidewalls thereof.

Source/drain regions 114 are formed in the substrate 106 on either side of channel regions 116 underlying the gates 108. As with the gates 108, the source/drain regions 114 are provided with silicide contacts in FIG. 2A. In the exemplary device 100, the substrate 106 is p-doped silicon, and the source/drain regions 114 of the NMOS transistor 102 are implanted with n-type dopants. An n-well 118 is formed in the substrate 106 beneath the PMOS device 104 using n-type dopants, wherein the source/drain regions 114 of the PMOS transistor 104 are implanted with p-type dopants. Isolation structures 120, such as field oxide regions (FOX) are formed in the substrate 106 outlying the devices 102 and 104 to provide electric isolation thereof from one another and from other electrical components in the device 100, such as using LOCOS or STI processes.

In FIG. 2B a first nitride layer 130 is formed over the wafer 100 to any desired thickness, such as 200–1000 Å using a first PECVD deposition process 132 (e.g., step 10 of method 2 in FIG. 1). As discussed above, the exemplary first PECVD process 132 employs an RF plasma excitation power of about 400–600 W at about 13.56 MHz, at a deposition chamber pressure of about 1.7–2.1 Torr using $NH_3$ (2–4 slm), $SiH_4$ (300–400 sccm), and $N_2$ (2–4 slm) gases. This provides the nitride material 130 having a tensile stress of about +7.0 E9 dynes/$cm^2$ to impart a compressive channel stress in the PMOS transistor 104. The compressive stress in the PMOS channel region 116 provides improved carrier mobility in the transistor 104 in accordance with an aspect of the present invention.

In FIG. 2C, a patterned resist mask 134 is formed, covering the PMOS transistor 104 and exposing the portion of the first nitride layer 130 over the NMOS transistor 102. Any appropriate photolithographic or other patterning techniques may be employed in forming the resist mask 124, as are known in the art. A first patterned etch process 136 is performed (e.g., step 12 of method 2) to remove the exposed portions of the first nitride material 130 from over the NMOS transistor 102, while leaving the first nitride 130 over the PMOS transistor 104, resulting in the structure of FIG. 2D. Any appropriate wet or dry etch process 136 may be used in removing the exposed first nitride material 130 in accordance with the invention.

Figure 2E:
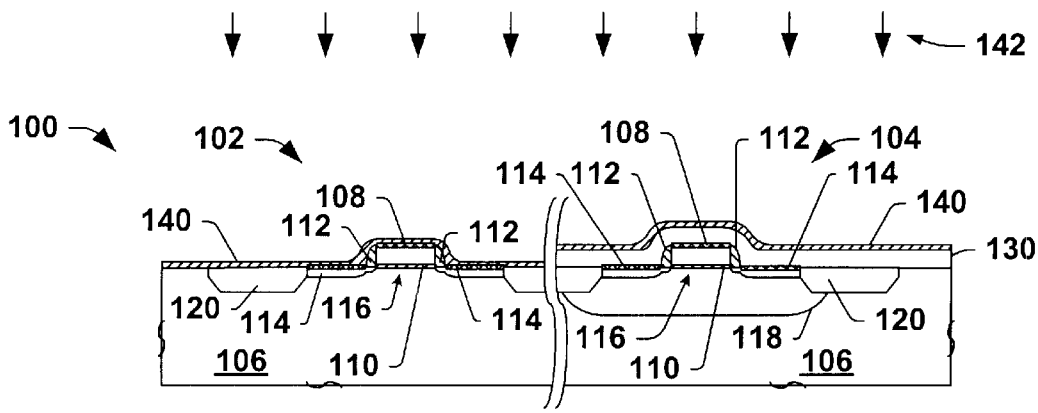
FIG. 2E is a partial side elevation view in section illustrating deposition of an oxide layer over the wafer of FIGS. 2A–2D.

In FIG. 2E, an oxide layer 140 is deposited over the wafer 100 to a thickness of b 50–200 Å, preferably about 100 Å (e.g., step 14 of method 2) via a deposition process 142. The oxide primarily serves in the illustrated example to aid in selectively providing a second nitride layer over the NMOS device 102, as discussed below with respect to FIGS. 2G and 2H. Any desired process may be employed for forming the oxide layer 140, including depositions and/or thermal oxidation processes as are known.

Figure 2F:
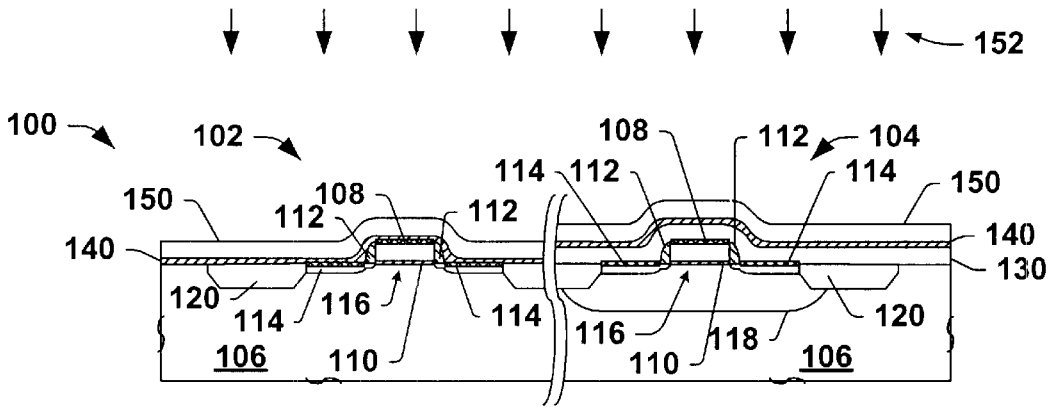
FIG. 2F is a partial side elevation view in section illustrating deposition of a second nitride compressive film layer over the wafer of FIGS. 2A–2E to create a tensile stress in the NMOS transistor in accordance with another aspect of the invention.

In FIG. 2F, a second nitride layer 150 is formed over the device 100 to a thickness of about 200–1000 Å via a second PECVD deposition process 152 (e.g., step 16 of method 2), having a compressive film stress for imparting a tensile stress in the underlying channel of the NMOS transistor 102. The exemplary second PECVD process 152 comprises a high frequency RF plasma excitation power of about 300–400 W at a frequency of about 13.56 MHz, at a deposition chamber pressure of about 1.7–2.1 Torr using $NH_3$, $SiH_4$, and $N_2$ gases. Low frequency RF heater power is also provided in the second PECVD process 152 at about 400–500 W, wherein the $NH_3$ gas is provided at a rate of about 2–4 slm, the $SiH_4$ gas is provided at about 300–400 sccm, and the $N_2$ gas is provided at about 2–4 slm while depositing the second (e.g., compressive stress) nitride film layer 150.

Figure 2G:
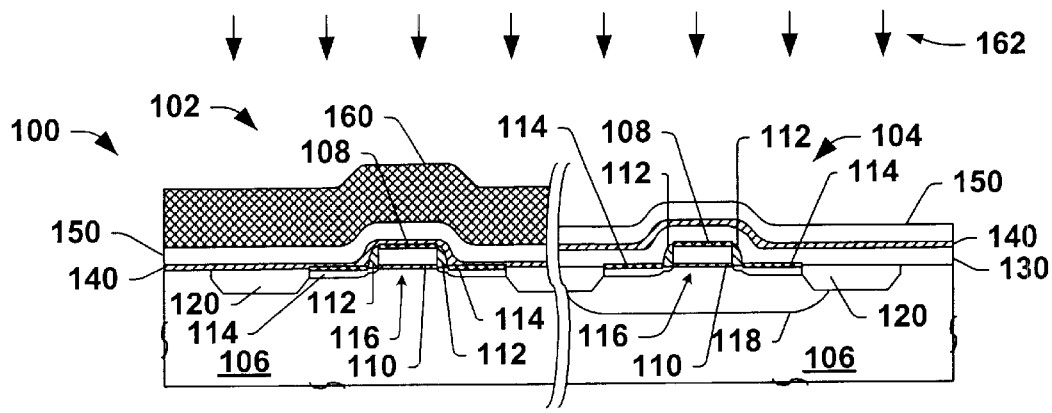
FIG. 2G is a partial side elevation view in section illustrating a second patterned etch process removing portions of the second nitride material from over the PMOS transistor and leaving the second nitride material over the NMOS transistor in the wafer of FIGS. 2A–2F.

As illustrated in FIG. 2G, a second patterned resist mask 260 is thereafter formed over the device 100, covering the second nitride 150 over the NMOS transistor 102, and exposing portions of the layer 150 over the PMOS transistor 104. A second patterned etch process 162 is performed (e.g., wet or dry etch), removing portions of the second nitride material 150 from over the PMOS transistor 104, while leaving the second nitride material 150 over the NMOS device 102, resulting in the structure of FIG. 2H.

Figure 2H:
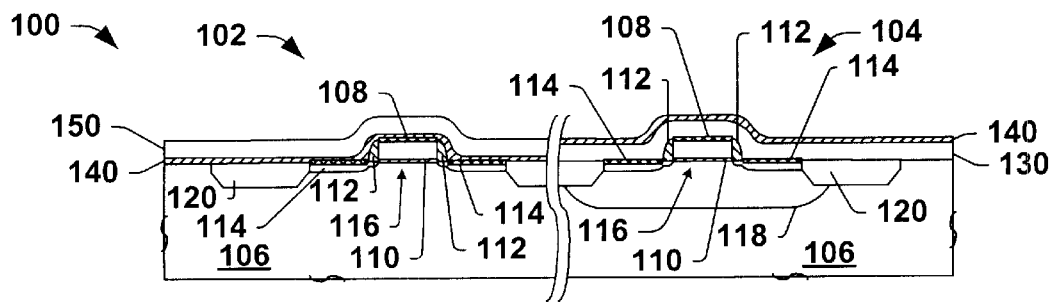
FIG. 2H is a partial side elevation view in section illustrating the wafer of FIGS. 2A–2G following removal of the second nitride material from over the PMOS transistor, wherein the tensile film remains over the PMOS transistor and the compressive film remains over the NMOS transistor to improve the PMOS and NMOS carrier mobilities.

It is noted in FIG. 2H that the deposition and selective patterned etching of the first and second (e.g., tensile and compressive) nitride layers 130 and 150 employ the intervening oxide layer 140 to facilitate the etching process 162 in FIG. 2G. Thus, the oxide layer 140 serves as an etch-stop layer for the etch process 162 in the illustrated implementation, wherein the oxide thickness can be made smaller depending upon etch selectivity of the process 162. In this regard, the oxide layer 140 need not be formed where an etch process 162 can be formulated to selectively etch the second nitride layer 150 without significantly removing the first nitride material 130. Other process modifications and alternate implementations are contemplated within the scope of the present invention, by which a tensile film is formed over PMOS devices and a compressive film is formed over NMOS devices in the manufacture of semiconductor products such as CMOS integrated circuits.

It is further seen from FIG. 2H that the resulting structure combines a tensile material film 130 creating a compressive stress in the channel region 116 of the PMOS transistor 104 with a compressive film 150 creating a tensile stress in the channel region 116 of the NMOS transistor 102, by which the inventors have appreciated that the carrier mobility of both devices 102 and 104 can be improved. Moreover, it will be appreciated that the tensile nitride layer 130 need not be formed prior to the compressive layer 150, and that the compressive film 150 can alternatively be formed first in accordance with the present invention.

Figure 2I:
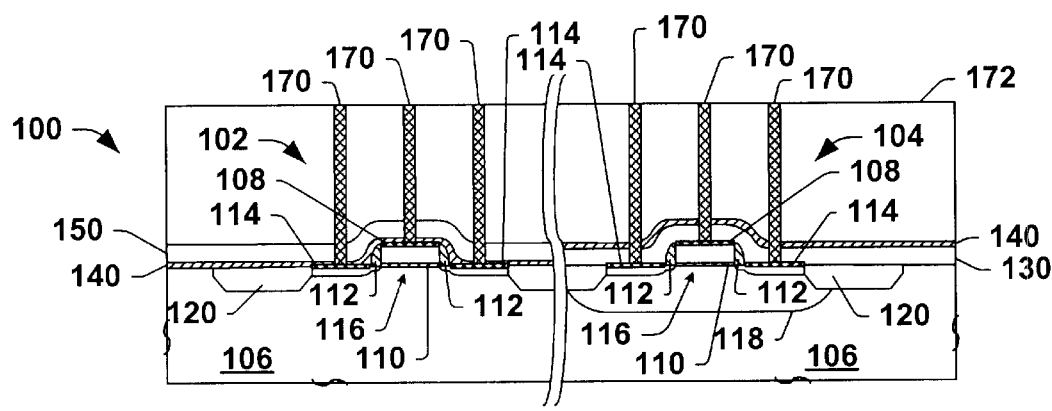
FIG. 2I is a partial side elevation view in section illustrating the wafer of FIGS. 2A–2H following formation of a first interconnect layer.

Following the processing to create the structure of FIG. 2H, further back-end processing may be carried out as illustrated in FIG. 2I, wherein one or more interconnect structures are fabricated in the device 100. For example, conductive contact structures 170 are formed in a first interlayer dielectric (ILD) layer 172 to provide for subsequent interconnection of the transistor gate and source/drain terminals to other electrical components in the device 100 using interconnect processes as are known.

Figure 3:
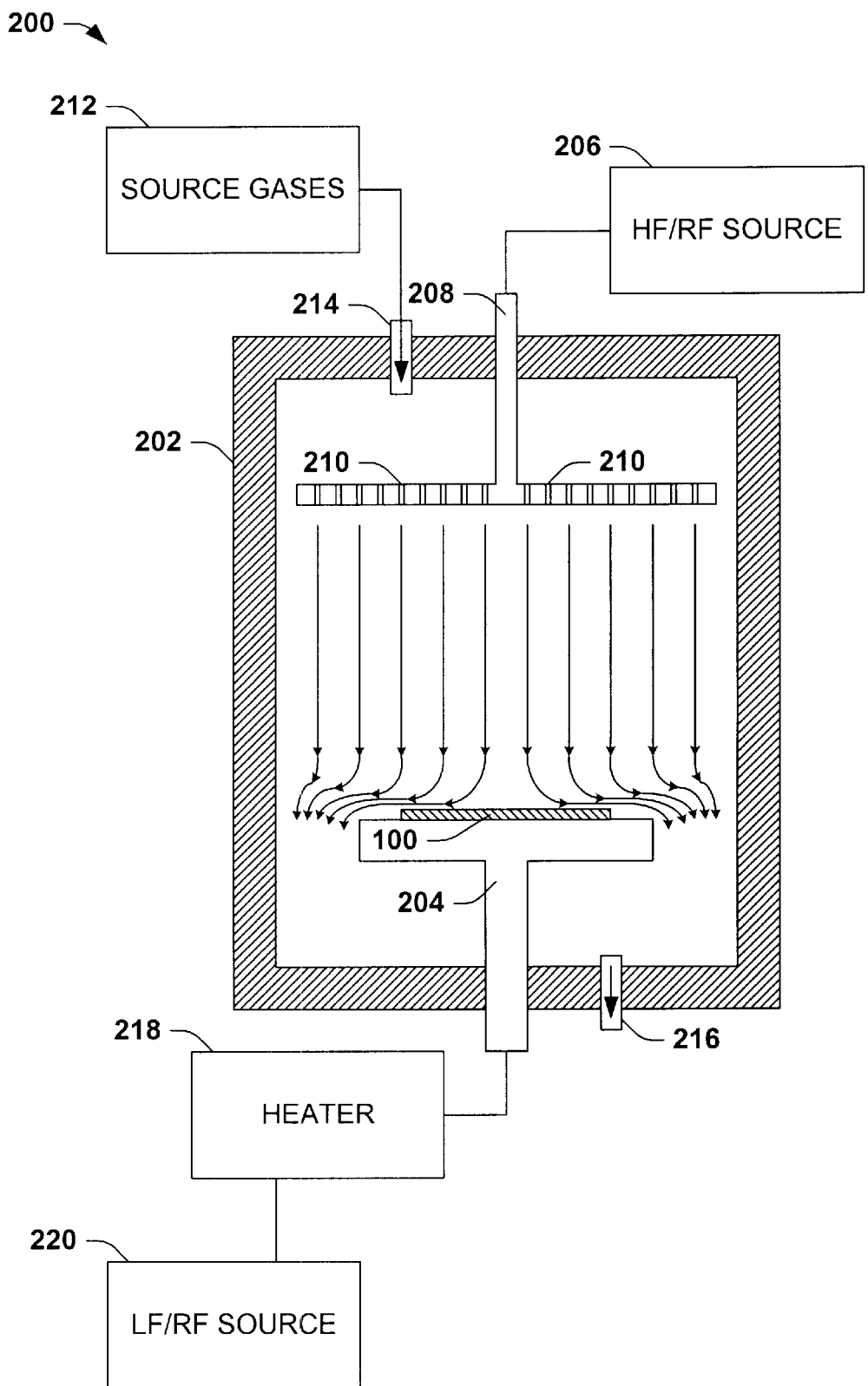
FIG. 3 is a simplified side elevation view in section illustrating an exemplary plasma-enhanced chemical vapor deposition system in which one or more aspects of the invention may be carried out.

FIG. 3 illustrates the wafer 100 undergoing a PECVD nitride layer deposition (e.g., steps 10 or 16 above) in an exemplary PECVD process system 200 in accordance with the present invention. The system 200 comprises a chamber housing or enclosure 202 in which the wafer 100 is located on an electrically grounded heater block wafer holder 204. A high frequency RF power source 206 provides electrical power to a shower head 208 having a series of apertures 210 extending therethrough, wherein the shower head 208 and the grounded support 204 act as electrodes to establish a field extending therebetween. One or more deposition process gases 212 (e.g., $NH_3$, $SiH_4$, and $N_2$ gases in the above example) are provided to the interior of the chamber 202 via an inlet port 214, and exhaust gas is removed from the chamber 202 through an outlet port 216. A heater 218 is provided for selectively heating the wafer 100 during deposition processing, wherein the heater 218 is powered by a low frequency heater power source 220.

In operation, a field is established in the chamber 202 to provide a plasma from which ions are directed toward the surface of the wafer 100. The plasma ionic bombardment combines with chemical vapor material deposition in the chamber 202, by which material is deposited on the wafer 100. The system 200 may be employed in performing one or both of the first and second nitride layer depositions in accordance with the present invention. For instance, the first nitride layer 130 may be deposited on the wafer 100 (e.g., process 132 of FIG. 2B above) in the system 200, wherein the high frequency RF source 206 provides about 400–600 W at about 13.56 MHz with the heater 218 unpowered. In this example, the deposition chamber pressure is controlled to about 1.7–2.1 Torr, and the source gasses 212 include $NH_3$ (2–4 slm), $SiH_4$ (300–400 sccm), and $N_2$ (2–4 slm). This provides the first nitride material layer 130 on the wafer 100 having a tensile stress of about +7.0 E9 dynes/$cm^2$ to impart a compressive channel stress in the PMOS transistor 104.

The system 200 can also be employed for the subsequent deposition of the second nitride layer 150 (e.g., process 152 in FIG. 2F above). For instance, the second nitride PECVD process 152 may be carried out using a high frequency RF plasma excitation power 206 of about 300–400 W at about 13.56 MHz, with the heater 218 provided with low frequency RF heater power from the source 220 at about 400–500 W. The interior of the chamber 202 is held at a pressure of about 1.7–2.1 Torr using $NH_3$ gas 212 provided at about 2–4 slm, $SiH_4$ gas 212 provided at about 300–400 sccm, and $N_2$ gas 212 provided at about 2–4 slm while depositing the second (e.g., compressive stress) nitride layer 150.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fabricating a semiconductor device, comprising:

forming a PMOS transistor and an NMOS transistor in a wafer;

forming a tensile film over the PMOS transistor; and forming a compressive film over the NMOS transistor.

2. The method of claim 1, wherein forming the tensile film comprises forming a first nitride layer over the PMOS transistor and wherein forming the compressive film comprises forming a second nitride layer over the NMOS transistor.

3. The method of claim 2, wherein forming the first nitride layer comprises causing a compressive stress in at least a portion of the PMOS transistor and wherein forming the second nitride layer comprises causing a tensile stress in at least a portion of the NMOS transistor.

4. The method of claim 3, wherein forming the first nitride layer comprises depositing a first nitride material over the PMOS transistor using a first PECVD process with a high frequency RF plasma excitation power of about 400 W or more, and wherein forming the second nitride layer comprises depositing a second nitride material over the NMOS transistor using a second PECVD process with a high frequency RF plasma excitation power of about 400 W or less.

5. The method of claim 4, wherein the first PECVD process comprises providing high frequency RF plasma excitation power at about 400 W or more and about 600 W or less at a pressure of about 1.7 Torr or more and about 2.1 Torr or less using $NH_3$, $SiH_4$, and $N_2$ gases, and wherein the second PECVD process comprises providing high frequency RF plasma excitation power at about 300 W or more and about 400 W or less and providing low frequency RF heater power at about 400 W or more and about 500 W or less at a pressure of about 1.7 Torr or more and about 2.1 Torr or less using $NH_3$, $SiH_4$, and $N_2$ gases.

6. The method of claim 5, wherein the first PECVD process comprises providing $NH_3$ gas at a flow rate of about 2 slm or more and about 4 slm or less, providing $SiH_4$ gas at a flow rate of about 300 sccm or more and about 400 sccm or less, and providing $N_2$ gas at a flow rate of about 2 slm or more and about 4 slm or less, and wherein the second PECVD process comprises providing $NH_3$ gas at a flow rate of about 2 slm or more and about 4 slm or less, providing $SiH_4$ gas at a flow rate of about 300 sccm or more and about 400 sccm or less, and providing $N_2$ gas at a flow rate of about 2 slm or more and about 4 slm or less.

7. The method of claim 5, wherein forming the first nitride layer comprises causing a compressive stress in a channel region of the PMOS transistor and wherein forming the second nitride layer comprises causing a tensile stress in a channel region of the NMOS transistor.

8. The method of claim 7, wherein forming the first nitride layer over the PMOS transistor comprises depositing the first nitride material over the wafer using the first PECVD process and selectively removing first nitride material from over the NMOS transistor using a first patterned etch process, and wherein forming the second nitride layer over the NMOS transistor comprises depositing the second nitride material over the wafer after the first patterned etch process using the second PECVD process and selectively removing second nitride material from over the PMOS transistor using a second patterned etch process.

9. The method of claim 8, comprising forming an oxide layer over the wafer following the first patterned etch process and prior to the second PECVD process.

10. The method of claim 4, wherein forming the first nitride layer comprises depositing the first nitride material over the PMOS transistor using the first PECVD process with a high frequency RF plasma excitation power of about 400 W or more and about 600 W or less, and wherein forming the second nitride layer comprises depositing the second nitride material over the NMOS transistor using the second PECVD process with a high frequency RF plasma excitation power of about 300 W or more and about 400 W or less.

11. The method of claim 10, wherein forming the first nitride layer comprises causing a compressive stress in a channel region of the PMOS transistor and wherein forming the second nitride layer comprises causing a tensile stress in a channel region of the NMOS transistor.

12. The method of claim 11, wherein forming the first nitride layer over the PMOS transistor comprises depositing the first nitride material over the wafer using the first PECVD process and selectively removing first nitride material from over the NMOS transistor using a first patterned etch process, and wherein forming the second nitride layer over the NMOS transistor comprises depositing the second nitride material over the wafer after the first patterned etch process using the second PECVD process and selectively removing second nitride material from over the PMOS transistor using a second patterned etch process.

13. The method of claim 3, wherein forming the first nitride layer comprises causing a compressive stress in a channel region of the PMOS transistor and wherein forming the second nitride layer comprises causing a tensile stress in a channel region of the NMOS transistor.

14. The method of claim 3, wherein forming the first nitride layer over the PMOS transistor comprises depositing the first nitride material over the wafer using the first PECVD process and selectively removing first nitride material from over the NMOS transistor using a first patterned etch process, and wherein forming the second nitride layer over the NMOS transistor comprises depositing the second nitride material over the wafer after the first patterned etch process using the second PECVD process and selectively removing second nitride material from over the PMOS transistor using a second patterned etch process.

15. The method of claim 14, comprising forming an oxide layer over the wafer following the first patterned etch process and prior to the second PECVD process.

16. The method of claim 2, wherein forming the tensile film comprises causing a compressive stress in a channel region of the PMOS transistor and wherein forming the compressive film comprises causing a tensile stress in a channel region of the NMOS transistor.

17. The method of claim 16, wherein forming the tensile film over the PMOS transistor comprises depositing a first nitride material over the wafer using a first PECVD process and selectively removing first nitride material from over the NMOS transistor using a first patterned etch process, and wherein forming the compressive film over the NMOS transistor comprises depositing a second nitride material over the wafer after the first patterned etch process using a second PECVD process and selectively removing second nitride material from over the PMOS transistor using a second patterned etch process.

18. The method of claim 17, comprising forming an oxide layer over the wafer following the first patterned etch process and prior to the second PECVD process.

19. The method of claim 1, wherein forming the tensile film comprises causing a compressive stress in a channel region of the PMOS transistor and wherein forming the compressive film comprises causing a tensile stress in a channel region of the NMOS transistor.

20. A method of improving carrier mobility of PMOS and NMOS transistors in the fabrication of CMOS devices in a wafer, comprising:

selectively forming a tensile film over the PMOS transistor and not over the NMOS transistor in the wafer to create a compressive stress in a channel region of the PMOS transistor; and selectively forming a compressive film over the NMOS transistor and not over the PMOS transistor to create a tensile stress in a channel region of the NMOS transistor.

21. The method of claim 20, wherein forming the tensile film comprises forming a first nitride layer over the PMOS transistor and not over the NMOS transistor, and wherein forming the compressive film comprises forming a second nitride layer over the NMOS transistor and not over the PMOS transistor.

22. The method of claim 21, wherein selectively forming the tensile film over the PMOS transistor and not over the NMOS transistor comprises depositing a first nitride material over the wafer using a first PECVD process and selectively removing first nitride material from over the NMOS transistor using a first patterned etch process, and wherein selectively forming the compressive film over the NMOS transistor and not over the PMOS transistor comprises depositing a second nitride material over the wafer after the first patterned etch process using a second PECVD process and selectively removing second nitride material from over the PMOS transistor using a second patterned etch process.

23. The method of claim 22, comprising forming an oxide layer over the wafer following the first patterned etch process and prior to the second PECVD process.

24. The method of claim 23, wherein the first PECVD process comprises providing high frequency RF plasma excitation power at about 400 W or more and about 600 W or less, and wherein the second PECVD process comprises providing high frequency RF plasma excitation power at about 300 W or more and about 400 W or less and providing low frequency RF heater power at about 400 W or more and about 500 W or less.

25. The method of claim 24, wherein the first PECVD process comprises providing $NH_3$ gas at a flow rate of about 2 slm or more and about 4 slm or less, providing $SiH_4$ gas at a flow rate of about 300 sccm or more and about 400 sccm or less, and providing $N_2$ gas at a flow rate of about 2 slm or more and about 4 slm or less at a pressure of about 1.7 Torr or more and about 2.1 Torr or less, and wherein the second PECVD process comprises providing $NH_3$ gas at a flow rate of about 2 slm or more and about 4 slm or less, providing $SiH_4$ gas at a flow rate of about 300 sccm or more and about 400 sccm or less, and providing $N_2$ gas at a flow rate of about 2 slm or more and about 4 slm or less at a pressure of about 1.7 Torr or more and about 2.1 Torr or less.

26. A method of fabricating CMOS devices in a wafer, comprising:

forming a PMOS transistor and an NMOS transistor in the wafer;

forming a tensile film over the wafer;

selectively removing the tensile film from over the NMOS transistor while leaving the tensile film over the PMOS transistor to provide a compressive stress in at least a portion of the PMOS transistor;

forming a compressive film over the wafer; and selectively removing the compressive film from over the PMOS transistor while leaving the compressive film over the NMOS transistor to provide a tensile stress in at least a portion of the NMOS transistor.

27. The method of claim 26, wherein forming the tensile film comprises depositing a first nitride material over the wafer using a first PECVD process, and wherein forming the compressive film comprises depositing a second nitride material over the wafer after removing the tensile film from over the NMOS transistor using a second PECVD process.

28. The method of claim 27, wherein the first PECVD process comprises providing high frequency RF plasma excitation power at about 400 W or more and about 600 W or less, and wherein the second PECVD process comprises providing high frequency RF plasma excitation power at about 300 W or more and about 400 W or less and providing low frequency RF heater power at about 400 W or more and about 500 W or less.

29. The method of claim 28, wherein the first PECVD process comprises providing $NH_3$ gas at a flow rate of about 2 slm or more and about 4 slm or less, providing $SiH_4$ gas at a flow rate of about 300 sccm or more and about 400 sccm or less, and providing $N_2$ gas at a flow rate of about 2 slm or more and about 4 slm or less at a pressure of about 1.7 Torr or more and about 2.1 Torr or less, and wherein the second PECVD process comprises providing $NH_3$ gas at a flow rate of about 2 slm or more and about 4 slm or less, providing $SiH_4$ gas at a flow rate of about 300 sccm or more and about 400 sccm or less, and providing $N_2$ gas at a flow rate of about 2 slm or more and about 4 slm or less at a pressure of about 1.7 Torr or more and about 2.1 Torr or less.

30. The method of claim 26, wherein selectively removing the tensile film comprises performing a first patterned etch process after the first PECVD deposition process to remove the tensile film from over the NMOS transistor while leaving the tensile film over the PMOS transistor, and wherein selectively removing the compressive film comprises performing a second patterned etch process after the second PECVD deposition process to remove the compressive film from over the PMOS transistor while leaving the compressive film over the NMOS transistor.

* * * * *